United States Patent
Mizuno et al.

(10) Patent No.: US 11,626,546 B2
(45) Date of Patent: Apr. 11, 2023

(54) LED PACKAGE AND METHOD FOR MANUFACTURING SAME

(71) Applicants: CITIZEN ELECTRONICS CO., LTD., Fujiyoshida (JP); CITIZEN WATCH CO., LTD., Nishitokyo (JP)

(72) Inventors: Toshiyuki Mizuno, Yamanashi (JP); Yoshihito Kitta, Fuefuki (JP)

(73) Assignees: CITIZEN ELECTRONICS CO., LTD., Fujiyoshida (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 17/573,527

(22) Filed: Jan. 11, 2022

(65) Prior Publication Data

US 2022/0140207 A1    May 5, 2022

Related U.S. Application Data

(62) Division of application No. 16/482,986, filed as application No. PCT/JP2018/003689 on Feb. 2, 2018, now abandoned.

(30) Foreign Application Priority Data

Feb. 2, 2017    (JP) .............................. JP2017-017853

(51) Int. Cl.
*H01L 33/54*    (2010.01)
*H01L 33/50*    (2010.01)

(52) U.S. Cl.
CPC ............ *H01L 33/54* (2013.01); *H01L 33/507* (2013.01); *H01L 2933/005* (2013.01); *H01L 2933/0041* (2013.01)

(58) Field of Classification Search
CPC .................. H01L 33/54; H01L 33/507; H01L 2933/0041; H01L 2933/005;
(Continued)

(56) References Cited

U.S. PATENT DOCUMENTS

2002/0105266 A1   8/2002   Juestel et al.
2002/0185966 A1   12/2002  Murano
(Continued)

FOREIGN PATENT DOCUMENTS

CN    1770488 A    5/2006
CN    103109385 A  5/2013
(Continued)

OTHER PUBLICATIONS

Office action dated Oct. 29, 2021 from counterpart DE Patent Application No. 11 2018 000 656.5, 17 pages.
(Continued)

*Primary Examiner* — Shahed Ahmed
(74) *Attorney, Agent, or Firm* — Procopio, Cory, Hargreaves & Savitch LLP

(57) ABSTRACT

Provided is an LED package and a method for manufacturing the same wherein, if its sealing resin containing phosphor particles each having a coating layer is cut or ground, age deterioration of the phosphor particles in the cut or ground surface is prevented. The method includes: mounting LED elements on a substrate; filling a first resin on the substrate to seal the LED elements, the first resin being transparent or translucent and containing wavelength conversion particles configured by forming a coating layer on at least part of the surface of each phosphor particle which converts the wavelength of light emitted from the LED elements; cutting or grinding the first resin; and forming a protective layer with a second resin on a cut surface of the first resin exposed as a result of the cutting or on a ground surface of the first resin, the second resin not containing the wavelength conversion particles.

7 Claims, 7 Drawing Sheets

(58) Field of Classification Search
CPC ............... H01L 25/0753; H01L 33/502; H01L 2933/0025; H01L 33/44; H01L 21/78–786; H01L 27/15–156; H01L 33/50–508; H01L 33/00–648
See application file for complete search history.

(56) References Cited

U.S. PATENT DOCUMENTS

| | | |
|---|---|---|
| 2002/0187570 A1 | 12/2002 | Fukasawa et al. |
| 2006/0065906 A1 | 3/2006 | Harada |
| 2006/0113895 A1* | 6/2006 | Baroky ................ H01L 33/502 |
| | | 313/501 |
| 2008/0003160 A1 | 1/2008 | Kim et al. |
| 2010/0127290 A1 | 5/2010 | Joo et al. |
| 2010/0258830 A1 | 10/2010 | Ide et al. |
| 2011/0001091 A1 | 1/2011 | Kim et al. |
| 2012/0319150 A1 | 12/2012 | Shimomura et al. |
| 2013/0149508 A1* | 6/2013 | Kwak ..................... B32B 27/06 |
| | | 428/690 |
| 2013/0320380 A1 | 12/2013 | Kanemaru |
| 2015/0048403 A1 | 2/2015 | Dan et al. |
| 2015/0083967 A1* | 3/2015 | Watanabe ............ H01L 33/501 |
| | | 252/301.4 R |
| 2015/0084075 A1 | 3/2015 | Watanabe |
| 2015/0108511 A1 | 4/2015 | Illek |
| 2015/0327446 A1 | 11/2015 | Kawaguchi et al. |
| 2017/0336035 A1 | 11/2017 | Lin et al. |
| 2018/0006204 A1* | 1/2018 | Takahashi ............... H01L 33/20 |
| 2018/0287020 A1 | 10/2018 | Kim et al. |
| 2019/0258098 A1 | 8/2019 | Oba et al. |

FOREIGN PATENT DOCUMENTS

| | | |
|---|---|---|
| DE | 102012209325 A1 | 12/2013 |
| JP | 2000200928 A | 7/2000 |
| JP | 2002223008 A | 8/2002 |
| JP | 2002-368281 A | 12/2002 |
| JP | 2006343409 A | 12/2006 |
| JP | 2008-007779 A | 1/2008 |
| JP | 2011-111506 A | 6/2011 |
| JP | 2012094578 A | 5/2012 |
| JP | 2013004807 A | 1/2013 |
| JP | 2013-251393 A | 12/2013 |
| JP | 2015-026778 A | 2/2015 |
| JP | 2015-065236 A | 4/2015 |
| JP | 2016-149386 A | 8/2016 |
| WO | 2009/066430 A1 | 5/2009 |

OTHER PUBLICATIONS

Office action dated Dec. 21, 2021 from counterpart JP Patent Application No. 2020-209479, 7 pages.
International Search Report and Written Opinion for related PCT App No. PCT/JP2018/003689 dated Apr. 17, 2018, 20 pages.
International Preliminary Report on Patentability for related PCT App No. PCT/JP2018/003689 dated Aug. 6, 2018, 10 pages.
Office Action dated Sep. 22, 2021 in counterpart CN Patent Application No. 201880009651.3, 15 pages.

* cited by examiner (A)

(B)

(C)

LED PACKAGE AND METHOD FOR MANUFACTURING SAME

CROSS-REFERENCE TO RELATED APPLICATIONS

This application is Divisional application of U.S. application Ser. No. 16/482,986 filed on Aug. 1, 2019, which is a U.S. National Stage entry of PCT Application No: PCT/JP2018/003689 filed Feb. 2, 2018, which claims priority to Japanese Patent Application No. 2017-017853, filed Feb. 2, 2017, the contents of which are incorporated herein by reference.

FIELD

The present invention relates to an LED package and a method for manufacturing the same.

BACKGROUND

Light-emitting devices (LED packages) are known in which a light-emitting diode (LED) element is mounted on a substrate and sealed with a translucent resin containing a phosphor. In such a light-emitting device, light emitted from the LED element is mixed with light generated by exciting the phosphor with the emitted light, thereby producing light of a desired color, such as white, according to the purpose.

Patent Literature 1 describes a method for manufacturing light-emitting diodes. This method includes coating multiple LED elements mounted on a substrate with a translucent resin, partially removing the cured translucent resin from space between the LED elements, filling a light-reflecting resin into grooves thus formed, and cutting the substrate so as to leave the cured light-reflecting resin around each LED element, thereby separating light-emitting diodes from each other.

Patent Literature 2 describes a surface-light-emitter unit wherein surface light emitters formed by sealing light-emitting elements with a sealing light-transmitting member mixed with a phosphor are provided on a substrate, a scattering light-transmitting member is filled between adjacent surface light emitters on the substrate, and exposed surfaces of the surface light emitters and scattering light-transmitting member are coated with a translucent film.

CITATION LIST

Patent Literature

Patent Literature 1: Japanese Unexamined Patent Publication No. 2002-368281
Patent Literature 2: Japanese Unexamined Patent Publication No. 2015-026778

SUMMARY

Particles of some phosphors have a coating layer, in order to prevent deterioration caused by external factors, such as heat, humidity and ultraviolet rays. If such phosphor particles are mixed in a sealing resin of LED elements and the sealing resin is cut or ground to manufacture LED packages, the coating layer of some phosphor particles is also cut by this cutting or grinding, causing broken surfaces of these particles to be exposed in the cut or ground surface of the sealing resin. Since this causes the effect of the coating layer preventing deterioration to be lost, phosphor particles in the cut surface deteriorate, which leads to partial discoloration of the sealing resin and deviation of the emission color from the designed color with the passage of time.

It is an object of the present invention to provide an LED package and a method for manufacturing the same wherein, if its sealing resin containing phosphor particles each having a coating layer is cut or ground, age deterioration of the phosphor particles in the cut or ground surface is prevented.

Provided is a method for manufacturing an LED package, including the steps of: mounting LED elements on a substrate; filling a first translucent resin on the substrate to seal the LED elements, the first translucent resin containing wavelength conversion particles configured by forming a coating layer on at least part of the surface of each phosphor particle which converts the wavelength of light emitted from the LED elements; cutting the first translucent resin; and forming a protective layer with a second translucent resin on a side surface of the first translucent resin which is an exposed cut surface, the second translucent resin not containing the wavelength conversion particles.

Preferably, in the forming step, the second translucent resin is applied to the side surface of the first translucent resin of each LED package having diced in the cutting step.

Preferably, the substrate is left uncut in the cutting step, and the forming step includes filling the second translucent resin into a groove of the first translucent resin formed by cutting, curing the second translucent resin, and entirely cutting the cured second translucent resin and the substrate in the thickness direction thereof, thereby obtaining diced LED packages wherein the side surface of the first translucent resin is coated with the second translucent resin.

The protective layer may also be formed on an upper surface of the first translucent resin in the forming step.

Provided is an LED package including: a substrate; an LED element mounted on the substrate; a first translucent resin filled on the substrate to seal the LED element, the first translucent resin containing wavelength conversion particles configured by forming a coating layer on at least part of the surface of each phosphor particle which converts the wavelength of light emitted from the LED element, the first translucent resin having a side surface which is a cut surface including the wavelength conversion particles whose coating layers are cut; and a protective layer covering the cut surface of the first translucent resin and made of a second translucent resin not containing the wavelength conversion particles.

Provided is a method for manufacturing an LED package, including the steps of: mounting LED elements on a substrate; filling a first resin on the substrate to seal the LED elements, the first resin being transparent or translucent and containing wavelength conversion particles configured by forming a coating layer on at least part of the surface of each phosphor particle which converts the wavelength of light emitted from the LED elements; cutting or grinding the first resin; and forming a protective layer with a second resin on a cut surface of the first resin exposed as a result of the cutting or on a ground surface of the first resin, the second resin not containing the wavelength conversion particles.

Preferably, the first resin is cut in the cutting or grinding step, the cut surface is a side surface of the first resin, and the second resin is applied to the side surface of the first resin in the forming step.

Preferably, in the cutting or grinding step, the first resin is cut while the substrate is left uncut, the cut surface is a side surface of the first resin, and the forming step includes filling the second resin into a groove of the first resin formed by cutting the first resin, curing the second resin, and entirely cutting the cured second resin and the substrate in the thickness direction thereof, thereby obtaining diced LED packages wherein the side surface of the first resin is coated with the second resin.

An upper surface of the first resin may be ground in the cutting or grinding step, and the protective layer may be formed on the upper surface of the first resin in the forming step.

Preferably, the LED elements are blue LED elements emitting blue light, and the phosphor particles are particles of KSF phosphor absorbing part of the blue light to emit red light.

Provided is an LED package including: a substrate; an LED element mounted on the substrate; a first resin filled on the substrate to seal the LED element, the first resin being transparent or translucent and containing wavelength conversion particles configured by forming a coating layer on at least part of the surface of each phosphor particle which converts the wavelength of light emitted from the LED element; and a protective layer covering a surface of the first resin and made of a second resin not containing the wavelength conversion particles, wherein the surface of the first resin includes broken surfaces of the wavelength conversion particles whose coating layers are cut.

Preferably, the second resin contains a scattering agent.

Preferably, the second resin is a transparent or translucent resin.

According to the above LED package and method, if its sealing resin containing phosphor particles each having a coating layer is cut or ground, age deterioration of the phosphor particles in the cut or ground surface can be prevented.

DESCRIPTION OF EMBODIMENTS

Hereinafter, with reference to the accompanying drawings, an LED package and a method for manufacturing the same will be explained in detail. However, note that the present invention is not limited to the drawings or the embodiments described below.

Figure 1:
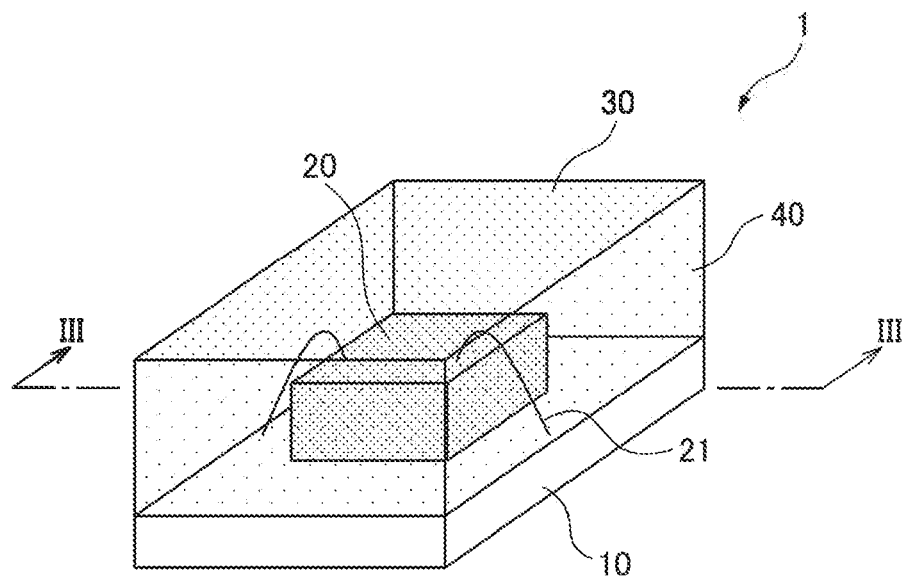
FIG. 1 is a perspective view of an LED package 1.

FIG. 1 is a perspective view of an LED package 1. The LED package 1 is a light-emitting device including an LED element as a light-emitting element and utilizing wavelength conversion of a phosphor for emitting white light, for example, and is used as an LED light source for various kinds of lighting equipment, for example. Major components of the LED package 1 include a mounting substrate 10, an LED element 20, a sealing resin 30 and a transparent resin coat 40. The LED package need not include only one LED element 20, but may include multiple LED elements 20 mounted on the mounting substrate 10.

The mounting substrate 10 includes two connecting electrodes (not shown) for connecting the LED element 20 to an external power source, and has an upper surface on which the LED element 20 is mounted. For example, the mounting substrate 10 may be a ceramic substrate, or a substrate constructed by bonding a metal board made of aluminum or copper, which excels in heat resistance and heat dissipation, to an insulating circuit board on which conductive patterns and connecting electrodes are formed for the LED element 20. Alternatively, the mounting substrate 10 may be a base of the LED package including a concave portion in which the LED element 20 is mounted and the sealing resin 30 is filled and two lead electrodes for connecting the LED element 20 to an external power source.

The LED element 20 is made of a gallium nitride compound semiconductor which emits light having a wavelength in the ultraviolet to blue regions, for example. In the following description, the LED element 20 is assumed to be a blue LED element which emits blue light having a wavelength in the range of about 450 to 460 nm, but may be an element which emits light having another wavelength. The LED element 20 is die-bonded on the upper surface of the mounting substrate 10, and has positive and negative electrodes electrically connected to the connecting electrodes on the mounting substrate 10 via two bonding wires (hereinafter, simply referred to as "wires") 21. If the LED package includes multiple LED elements 20, the LED elements 20 are also electrically connected via the wires 21 with each other.

The sealing resin 30 is an example of the first resin (or first translucent resin), and is transparent or translucent. "Translucent" means being not completely transparent but semi-transparent and allowing light to pass through. The sealing resin 30 contains phosphor particles (wavelength conversion particles) for converting the wavelength of light emitted from the LED element 20, and is filled on the mounting substrate 10 to integrally seal the LED element 20 and wires 21. The phosphor particles may be uniformly dispersed in the sealing resin 30, or deposited near the upper surface of the mounting substrate 10 so that the density thereof increases downward in the sealing resin 30. The sealing resin 30 is an epoxy or silicone resin, for example.

The sealing resin 30 may contain only one phosphor, or two or more phosphors. For example, the sealing resin 30 contains KSF and YAG phosphors, which are a yellow and a red phosphor, respectively. Of these, KSF phosphor ($K_2SiF_6:Mn^{4+}$) absorbs part of blue light emitted by the LED element 20 to emit red light having a peak in the wavelength range of 610 to 650 nm. In this case, the LED package 1 mixes blue light emitted from the LED element 20 and yellow and red light generated by exciting the yellow and red phosphors with the blue light, thereby emitting white light.

The transparent resin coat 40 is an example of the protective layer made of the second resin (or second translucent resin), contains no phosphor particles, and covers the four side surfaces of the sealing resin 30. As described later, the side surfaces of the sealing resin 30 are cut surfaces formed during manufacture of the LED package 1. The transparent resin coat 40 is a dampproof coating applied to these cut surfaces. Since the upper surface of the sealing resin 30 (surface opposite to the mounting substrate 10) is not a cut surface, the transparent resin coat 40 is not provided on the upper surface thereof. The transparent resin coat 40 is also an epoxy or silicone resin, for example. The material of the sealing resin 30 may be the same as or different from that of the transparent resin coat 40. Preferably, the sealing resin 30 and transparent resin coat 40 have a light transmittance of 80% or more, and a water absorption of 1% or less.

Figure 2:
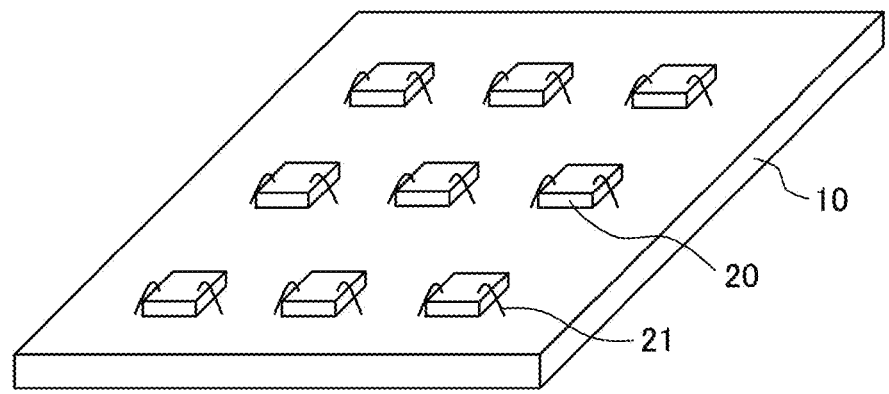
FIGS. 2(A) to 2(C) are diagrams for explaining manufacturing steps of the LED package 1.
Figure 2:
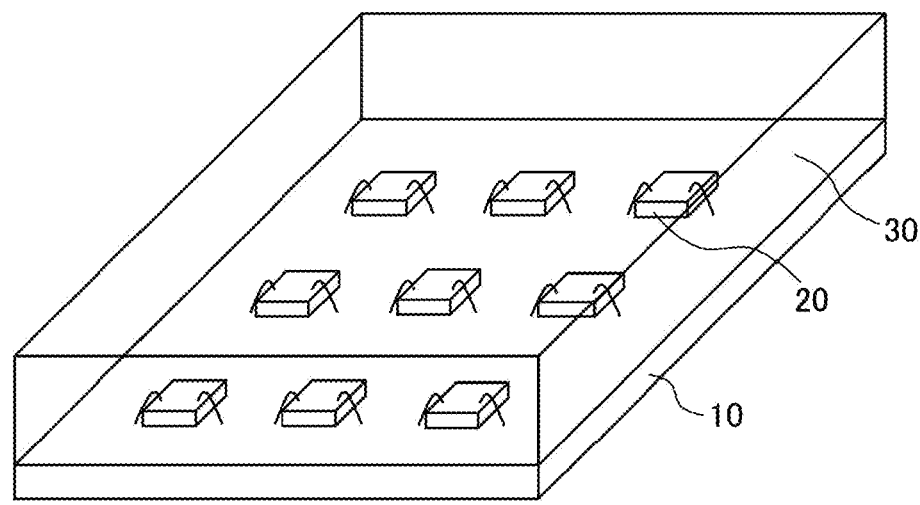
Figure 2:
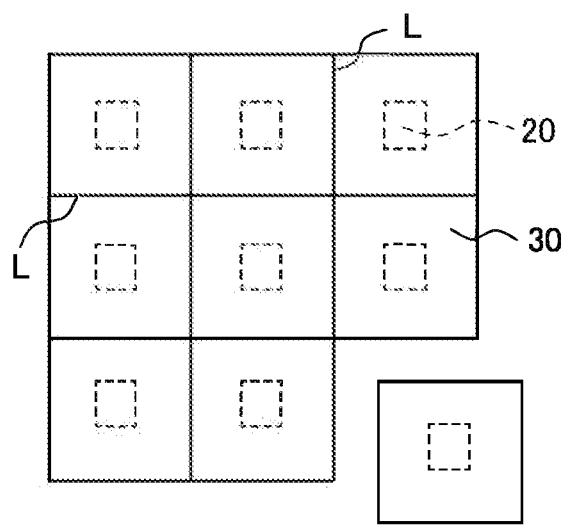

FIGS. 2(A) to 2(C) are diagrams for explaining manufacturing steps of the LED package 1. In manufacturing the LED package 1, as shown in FIG. 2(A), LED elements 20 are first die-bonded on the upper surface of the mounting substrate 10, and then the positive and negative electrodes of the LED elements 20 are connected to the connecting electrodes on the mounting substrate 10 via bonding wires (mounting step). Subsequently, as shown in FIG. 2(B), the sealing resin 30 containing the above-mentioned phosphors is filled on the upper surface of the mounting substrate 10, to integrally seal the LED elements 20 and wires 21 (sealing step). At this time, the sealing resin 30 may be kept uncured for several hours, for example, thereby causing the phosphors in the sealing resin 30 to be naturally deposited on the upper surfaces of the mounting substrate 10 and LED elements 20, and then the sealing resin 30 may be cured.

Thereafter, as shown in FIG. 2(C), the mounting substrate 10 and sealing resin 30 are cut lengthwise and crosswise along cutting lines L to divide the LED elements 20 (cutting step). Then, for each diced LED package, the transparent resin coat 40 is applied to the side surfaces of the sealing resin 30, which are exposed cut surfaces, by spraying or vapor deposition, for example (forming step of the protective layer). In this way, the LED package 1 shown in FIG. 1 is completed.

Figure 3:
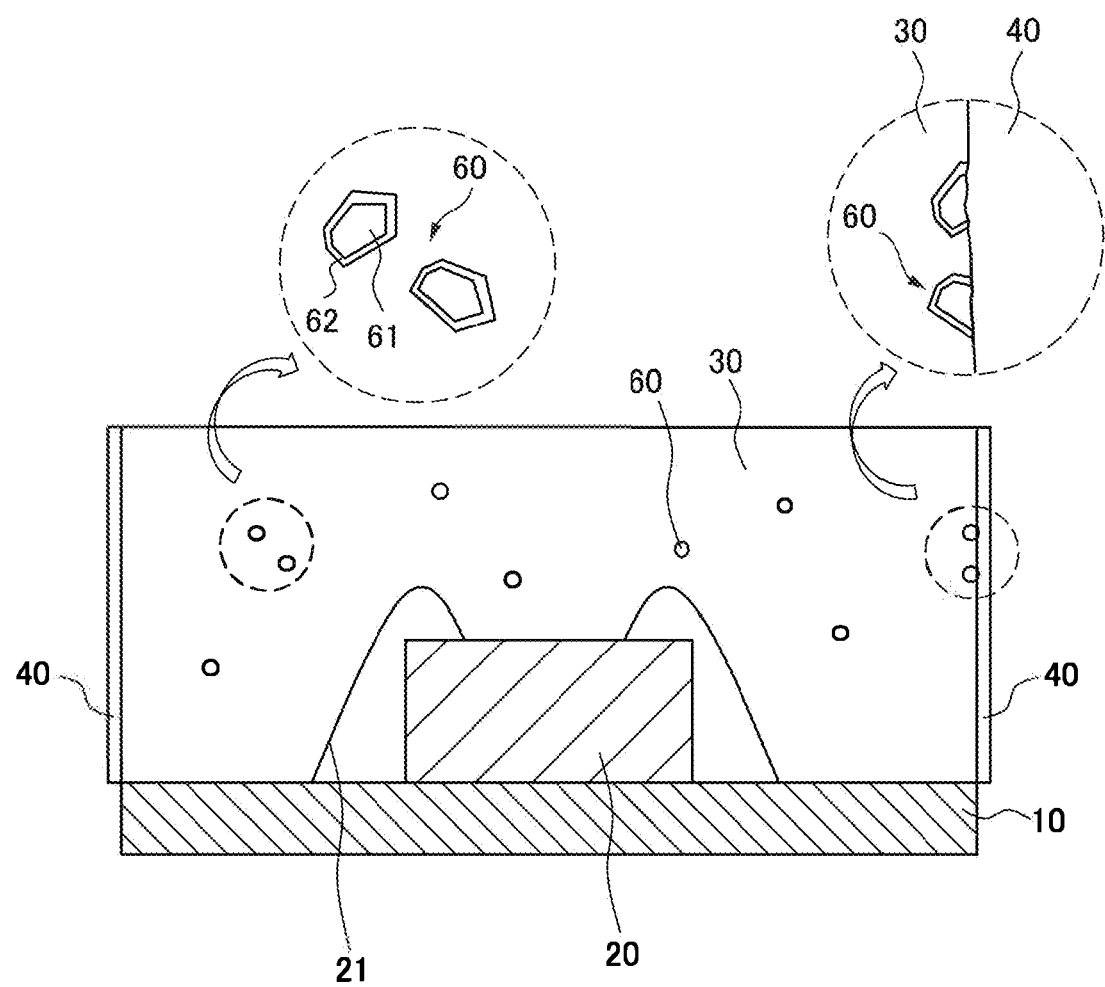
FIG. 3 is a cross-sectional view of the LED package 1 taken along line in FIG. 1.

FIG. 3 is a cross-sectional view of the LED package 1 taken along lines in FIG. 1. In FIG. 3, KSF phosphor particles are exaggerated in order to illustrate the cut surface of the sealing resin 30, and thus the proportions of the illustrated elements are not necessarily correct. Since KSF phosphor is water-soluble and has lower resistance to moisture than YAG or other phosphors, a coating layer (dampproof coating) 62 is formed on each phosphor particle 61 as shown in enlarged form in FIG. 3. Hereinafter, phosphor particles 61 each having a coating layer 62 are also referred to as "wavelength conversion particles 60" for convenience sake.

When the sealing resin 30 is cut in the cutting step during manufacture of the LED package 1, the coating layer 62 of the wavelength conversion particles 60 are cut and their broken surfaces are exposed in the side surfaces of the sealing resin 30, as shown in FIG. 3. KSF phosphor has lower resistance to moisture, and cutting the wavelength conversion particles 60 in this way causes the effect of the coating layers 62 to be lost. Thus, if left as it is, the phosphor included in the cut surface deteriorates due to moisture in the air, causing the color of emitted light to differ from the designed color. In particular, if phosphor particles are deposited in the sealing resin 30, these particles are crowded near the upper surface of the mounting substrate 10 and that portion is cut; thus, deterioration of KSF phosphor may occur more conspicuously.

However, in the LED package 1, even if broken surfaces of the wavelength conversion particles 60 are exposed in the cutting step, the transparent resin coat 40 applied to the cut surfaces of the sealing resin 30 covers the broken surfaces and thus prevent them from being exposed to the air. Since the upper surface of the sealing resin 30 is not a cut surface, broken surfaces of the wavelength conversion particles 60 are not exposed there. Accordingly, in the LED package 1, even if KSF phosphor, which easily deteriorates over time, is used, deterioration of the phosphor and discoloration of the emitted light are prevented. Since the transparent resin coat 40 is made of a resin having a high light transmittance, brightness of the LED package 1 hardly decreases even with the transparent resin coat 40.

Figure 4:
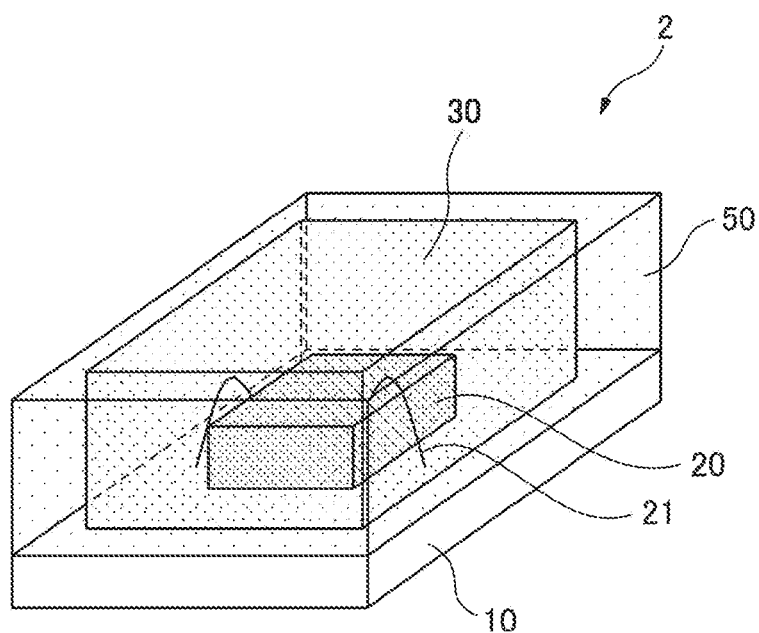
FIG. 4 is a perspective view of an LED package 2.

FIG. 4 is a perspective view of an LED package 2. Major components of the LED package 2 include a mounting substrate 10, an LED element 20, a sealing resin 30 and a transparent resin wall 50. The LED package 2 is identical in structure to the LED package 1 of FIG. 1, except that the transparent resin coat 40 of the LED package 1 is replaced with the transparent resin wall 50.

The transparent resin wall 50 is an example of the protective layer made of the second resin (or second translucent resin), contains no phosphor particles, and covers the four side surfaces of the sealing resin 30, similarly to the transparent resin coat 40. The transparent resin wall 50 is made of the same resin as the transparent resin coat 40 of the LED package 1, for example, but laterally thicker than the transparent resin coat 40, and corresponds to a resin frame enclosing the sealing resin 30. Preferably, the transparent resin wall 50 also has a light transmittance of 80% or more, and a water absorption of 1% or less.

Figure 5:
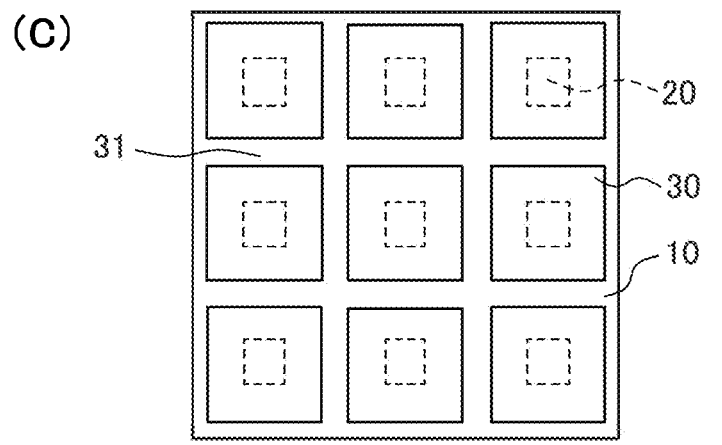
FIGS. 5(C) to 5(E) are diagrams for explaining manufacturing steps of the LED package 2.
Figure 5:
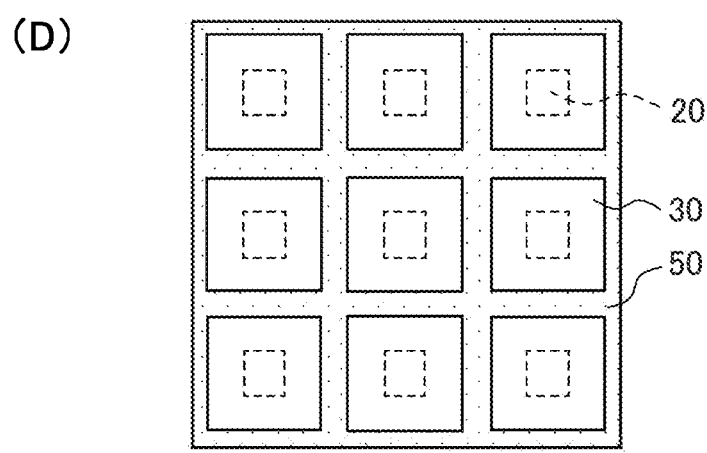
Figure 5:
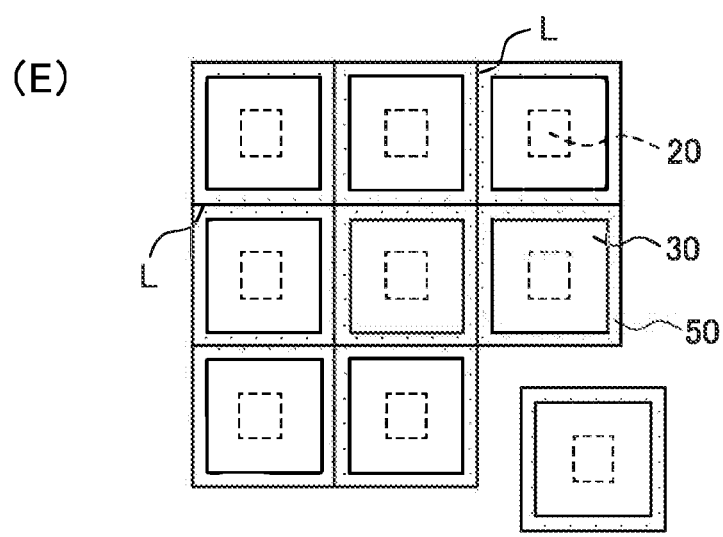

FIGS. 5(C) to 5(E) are diagrams for explaining manufacturing steps of the LED package 2. In manufacturing the LED package 2, LED elements 20 are first mounted on the upper surface of the mounting substrate 10, and sealed with the sealing resin 30 containing the above-mentioned phosphors, together with wires 21. Since figures corresponding to these step are the same as FIGS. 2(A) and 2(B) for the LED package 1, they are omitted from illustration.

Subsequently, as shown in FIG. 5(C), the sealing resin 30 is entirely cut in the thickness direction while the mounting substrate 10 is left uncut, for example, thereby forming grooves 31. Then, as shown in FIG. 5(D), a transparent resin is filled into the grooves 31 of the sealing resin 30, and cured to form the transparent resin wall 50. Further, as shown in FIG. 5(E), the transparent resin wall 50 and mounting substrate 10 are entirely cut in the thickness direction along cutting lines L to divide the LED elements 20. In this way, the LED package 2 shown in FIG. 4 is completed.

Also in the LED package 2, even if KSF phosphor, which easily deteriorates over time, is used, deterioration of the phosphor and discoloration of the emitted light are prevented, similarly to the LED package 1. Since the transparent resin wall 50 is made of a resin having a high light transmittance, the LED package 2 can emit light even from its side surfaces, which ensures wide-ranging emission.

If manufacturing steps of the LED package include cutting the sealing resin 30 or grinding a surface thereof, the protective layer formed on the cut or ground surface of the sealing resin 30 has the same effect of preventing deterioration of the phosphor and discoloration of the emitted light; the cutting is not limited to the step for dividing the elements into pieces.

Figure 6:
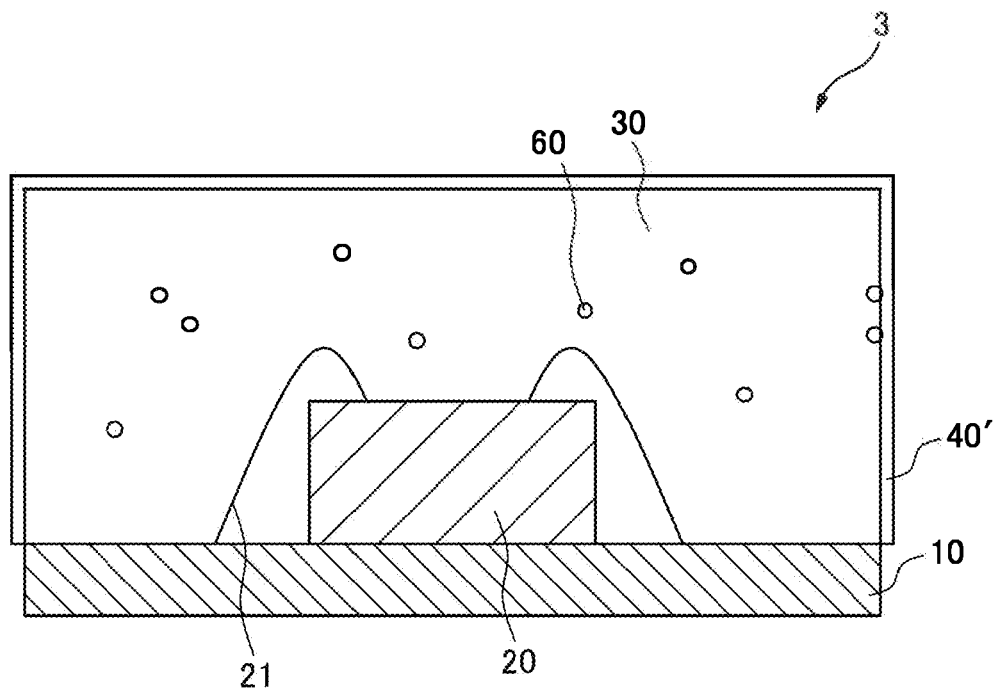
FIG. 6 is a cross-sectional view of an LED package 3.

FIG. 6 is a cross-sectional view of an LED package 3. FIG. 6 shows a vertical cross section of the LED package 3, similarly to FIG. 3. Major components of the LED package 3 include a mounting substrate 10, an LED element 20, a sealing resin 30 and a transparent resin coat 40'. The LED package 3 differs from the LED package 1 of FIG. 1 in that the upper surface of the sealing resin 30 is also provided with the transparent resin coat 40', but is otherwise identical thereto.

The transparent resin coat 40' is an example of the protective layer made of the second resin (or second translucent resin), contains no phosphor particles, and covers the four side surfaces and upper surface of the sealing resin 30. As in the LED package 3, the protective layer for preventing deterioration of the phosphor may be formed to cover not only the side surfaces but all of the exposed surfaces of the sealing resin 30. For example, if the upper surface of the sealing resin 30 is ground during manufacture of the LED package, this grinding causes broken surfaces of the wavelength conversion particles 60 to be exposed in the upper surface of the sealing resin 30; accordingly, the transparent resin coat 40' may also be formed on the upper surface of the sealing resin 30.

The transparent resin wall 50 of the LED package 2, which is thicker than the transparent resin coat 40, may also be formed to cover the four side surfaces and upper surface of the sealing resin 30.

Figure 7:
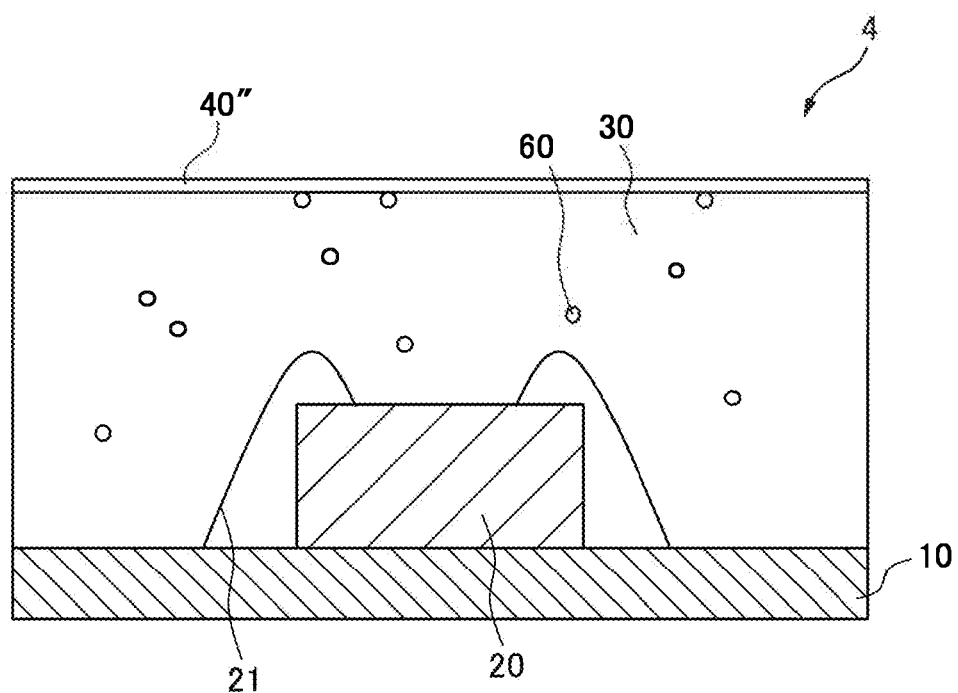
FIG. 7 is a cross-sectional view of an LED package 4.

FIG. 7 is a cross-sectional view of an LED package 4. FIG. 7 also shows a vertical cross section of the LED package 4, similarly to FIG. 3. The LED package 4 differs from the LED packages 1, 3 of FIGS. 1, 6 in that the transparent resin coat 40, 40' of the LED package 1, 3 is replaced with a transparent resin coat 40", but is otherwise identical thereto. The transparent resin coat 40" of the LED package 4 is an example of the protective layer made of the second resin (or second translucent resin), and is provided only on the upper surface of the sealing resin 30. If manufacturing steps of the LED package do not include cutting the side surfaces of the sealing resin 30 but include grinding the upper surface thereof, the transparent resin coat 40" may be formed only on the upper surface of the sealing resin 30 where broken surfaces of the wavelength conversion particles 60 are exposed, as in the LED package 4.

Figure 8:
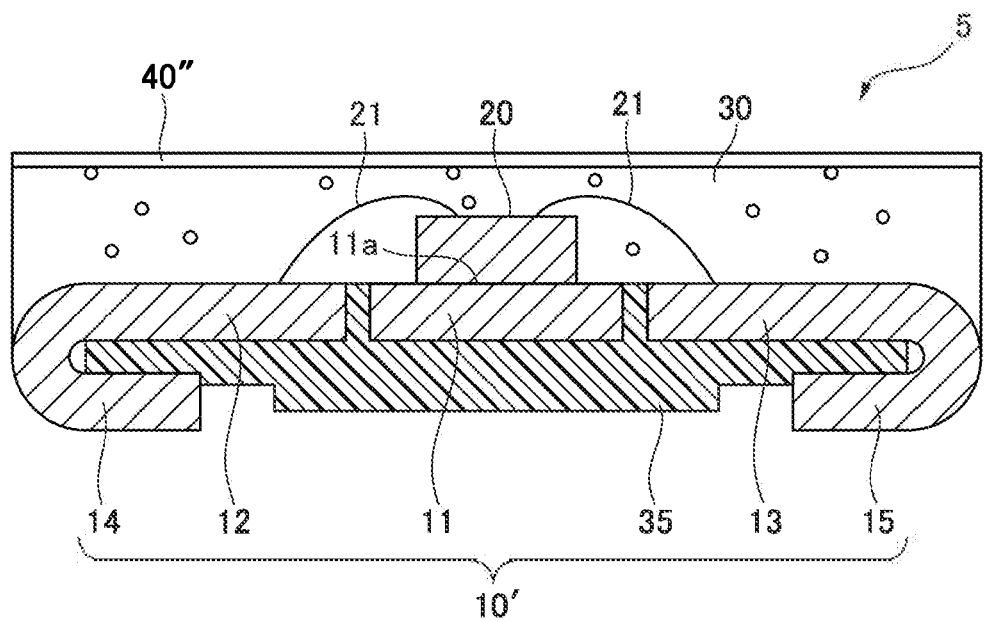
FIG. 8 is a cross-sectional view of an LED package 5.

FIG. 8 is a cross-sectional view of an LED package 5. FIG. 8 also shows a vertical cross section of the LED package 5, similarly to FIG. 3. The LED package 5 differs from the LED package 4 of FIG. 7 in that the mounting substrate 10 of the LED package 4 is replaced with a lead frame 10', but is otherwise identical thereto.

The lead frame 10' includes a die pad 11 on which the LED element 20 is mounted, and terminals 12, 13 separated from the die pad 11. Space between the die pad 11 and the terminals 12, 13 is filled with an insulating resin 35, which electrically insulates the die pad 11 from the terminals 12, 13. The cross sections of the terminals 12, 13 are substantially J-shaped. Edges of the terminals 12, 13 correspond to outer leads 14, 15, respectively. The LED element 20 is mounted on a mounting surface 11a of the die pad 11, and electrically connected to the terminals 12, 13 via wires 21.

Manufacturing steps of the LED package 5 do not include cutting the side surfaces of the sealing resin 30, but may include grinding the upper surface thereof. Thus, the upper surface of the sealing resin 30 where broken surfaces of the wavelength conversion particles 60 are exposed is provided with a transparent resin coat 40". If not only the upper surface but also the side surfaces of the sealing resin 30 are ground, the transparent resin coat may also be formed similarly on these ground surfaces.

The transparent resin coats 40, 40', 40" and transparent resin wall 50 need not be completely transparent, but may be a translucent and semitransparent resin. In particular, the transparent resin wall 50 of the LED package 2 may be replaced with a white resin wall, if it is desired to emit light upward. In particular, the transparent resin coats 40', 40", which cover the upper surface of the sealing resin 30, may contain a scattering agent. The scattering agent diffuses light in the transparent resin coat, allowing all the upper surface of the sealing resin 30 to emit light uniformly.

Even if a phosphor other than KSF phosphor is used, the transparent resin coat 40, 40', 40" or transparent resin wall 50 may be formed similarly to the LED packages 1 to 5. If each particle of the phosphor has a coating layer for preventing deterioration and manufacturing steps of the LED package include cutting or grinding the sealing resin 30, the effect of preventing deterioration of the phosphor and discoloration of the emitted light may be produced.

The LED element 20 need not be mounted by wire bonding, but may be flip-chip mounted. Unlike the LED packages 1 to 5, even if a phosphor board for wavelength conversion is placed on the upper surface of the LED element 20, for example, a transparent resin coat or wall may be formed similarly on that board. If the phosphor board has a cut or ground surface, the effect of preventing deterioration of the phosphor and discoloration of the emitted light may be produced.

The invention claimed is:

1. A method for manufacturing an LED package, comprising the steps of:
   mounting LED elements on a substrate;
   filling a first resin on the substrate to seal the LED elements, the first resin being transparent or translucent and containing wavelength conversion particles configured by forming a coating layer on at least part of the surface of each phosphor particle which converts the wavelength of light emitted from the LED elements;
   cutting the substrate and the first resin, and dividing the LED elements; and
   forming a dampproof coating with a second resin on a cut surface of the first resin exposed as a result of the cutting, the second resin not containing the wavelength conversion particles.

2. The method according to claim 1, wherein the dampproof coating is formed on only the cut surface by spraying or vapor deposition in the forming step.

3. The method according to claim 1, wherein the second resin have a water absorption of 1% or less.

4. The method according to claim 1, wherein
   the cut surface is a side surface of the first resin, and
   the second resin is applied to the side surface of the first resin in the forming step.

5. The method according to claim 1, further comprising grinding an upper surface of the first resin, and
   forming a protective layer on the upper surface of the first resin in the forming the dampproof coating.

6. The method according to claim 1, wherein
   the LED elements are blue LED elements emitting blue light, and
   the phosphor particles are particles of KSF phosphor absorbing part of the blue light to emit red light.

7. The method according to claim 1, wherein the second resin is a transparent or translucent resin.

* * * * *